(12) United States Patent
Bartley et al.

(10) Patent No.: US 9,488,690 B2
(45) Date of Patent: *Nov. 8, 2016

(54) RESIDUAL MATERIAL DETECTION IN BACKDRILLED STUBS

(71) Applicant: International Business Machines Corporation, Armonk, NY (US)

(72) Inventors: Gerald K. Bartley, Rochester, MN (US); Darryl J. Becker, Rochester, MN (US); Matthew S. Doyle, Rochester, MN (US); Philip R. Germann, Oronoco, MN (US); Mark O. Maxson, Mantorville, MN (US)

(73) Assignee: International Business Machines Corporation, Armonk, NY (US)

(*) Notice: Subject to any disclaimer, the term of this patent is extended or adjusted under 35 U.S.C. 154(b) by 225 days.

This patent is subject to a terminal disclaimer.

(21) Appl. No.: 14/462,628

(22) Filed: Aug. 19, 2014

(65) Prior Publication Data

US 2015/0338457 A1 Nov. 26, 2015

Related U.S. Application Data

(63) Continuation of application No. 14/281,952, filed on May 20, 2014, now Pat. No. 9,341,670.

(51) Int. Cl.
| | | |
|---|---|---|
| *G01R 1/067* | (2006.01) | |
| *G01R 31/28* | (2006.01) | |
| *B23Q 17/20* | (2006.01) | |
| *G01R 27/26* | (2006.01) | |

(Continued)

(52) U.S. Cl.
CPC ........... *G01R 31/2801* (2013.01); *B23Q 17/20* (2013.01); *G01R 1/067* (2013.01); *G01R 27/2605* (2013.01); *G01R 31/28* (2013.01); *H05K 3/0047* (2013.01); *H05K 3/429* (2013.01); *H05K 1/0251* (2013.01); *H05K 2201/096* (2013.01); *H05K 2201/09845* (2013.01); *H05K 2203/0207* (2013.01); *H05K 2203/163* (2013.01); *Y10T 29/49005* (2015.01); *Y10T 29/49156* (2015.01); *Y10T 29/49726* (2015.01); *Y10T 408/05* (2015.01)

(58) Field of Classification Search
CPC combination set(s) only.
See application file for complete search history.

(56) References Cited

U.S. PATENT DOCUMENTS

| | | |
|---|---|---|
| 6,309,151 B1 | 10/2001 | Sacchetti |
| 6,879,404 B2 | 4/2005 | Jagiella et al. |

(Continued)

OTHER PUBLICATIONS

Bartley, G. et al, "Residual Material Detection in Backdrilled Stubs," U.S. Appl. No. 14/281,952, filed May 20, 2014.

(Continued)

*Primary Examiner* — Walter L Lindsay, Jr.
*Assistant Examiner* — Jas Sanghera
(74) *Attorney, Agent, or Firm* — Robert Williams; Nicholas D. Bowman

(57) ABSTRACT

A stub of a via formed in a printed circuit board is backdrilled to a predetermined depth. A capacitance probe is positioned within the via. Then the capacitance probe is used to obtain a test capacitance measurement. The test capacitance measurement is compared to a predetermined baseline capacitance measurement. Residual conductive plating material in the backdrilled stub causes the test capacitance measurement to exceed the predetermined baseline capacitance measurement. An indication is made that the predetermined baseline capacitance measurement has been exceeded.

10 Claims, 7 Drawing Sheets

(51) Int. Cl.
  *H05K 3/00* (2006.01)
  *H05K 3/42* (2006.01)
  *H05K 1/02* (2006.01)

(56) References Cited

U.S. PATENT DOCUMENTS

| | | | |
|---|---|---|---|
| 7,096,555 B2 | 8/2006 | Tourne et al. | |
| 7,488,676 B2 | 2/2009 | Kanaya et al. | |
| 8,604,357 B2 | 12/2013 | Takeda | |
| 9,202,783 B1* | 12/2015 | Simpson | H01L 23/49838 |
| 9,341,670 B2* | 5/2016 | Bartley | G01R 31/2801 |
| 2007/0286693 A1 | 12/2007 | Cho et al. | |
| 2008/0217052 A1* | 9/2008 | Matsui | H05K 1/0268 |
| | | | 174/266 |
| 2011/0240348 A1* | 10/2011 | Lau | H05K 1/0251 |
| | | | 174/257 |
| 2012/0012380 A1 | 1/2012 | Miller | |
| 2012/0288336 A1 | 11/2012 | Berg | |

OTHER PUBLICATIONS

IBM, "List of IBM Patents or Patent Applications Treated as Related."

* cited by examiner

RESIDUAL MATERIAL DETECTION IN BACKDRILLED STUBS

BACKGROUND

The present disclosure relates to printed circuit boards, and more specifically, to backdrilling in vias of printed circuit boards.

Often multiple vias may be used in a multi-layered printed circuit board to electrically connect conductive traces in differing conductive layers of the board. During the manufacturing of the printed circuit board, the vias may be created by plating predrilled holes in the board with a conductive material (typically Copper). The entire depth of the via, including an unused portion of the via called a stub, may be plated with the copper material. In this context, a stub may refer to the portion of the via extending beyond an intended trace escape layer within the board. Left unchanged, the plated stub portion may adversely degrade electrical signals traveling through the desired portion of the via (i.e., into the desired trace escape layer) during use of the completed circuit board.

In order to reduce the impact of stubs on circuit board performance, the stubs may be removed from the board, or at least shortened, during the manufacturing process. One method for removing stubs is called backdrilling. In this process, a drill bit, preferably one which has a slightly larger diameter than the bit used in predrilling the hole for the via (prior to plating), may be used by a drill for boring into the via and removing the plating material from its stub portion. Once the undesirable plating material is carved out, and the stub is effectively removed, the stub's negative impact on electric signals passing through the board may be substantially reduced.

SUMMARY

According to embodiments of the present disclosure, aspects of the disclosure may include a method, a system, and a computer program product for measuring and assessing the adequacy of a backdrilling operation. The method, system, and computer program product may include backdrilling a stub of a via formed in a printed circuit board to a predetermined depth. A capacitance probe may be positioned within the via. Then the capacitance probe may be used to obtain a test capacitance measurement. The test capacitance measurement may be compared to a predetermined baseline capacitance measurement. Residual conductive plating material in the backdrilled stub may cause the test capacitance measurement to exceed the predetermined baseline capacitance measurement. An indication may be made that the predetermined baseline capacitance measurement has been exceeded.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
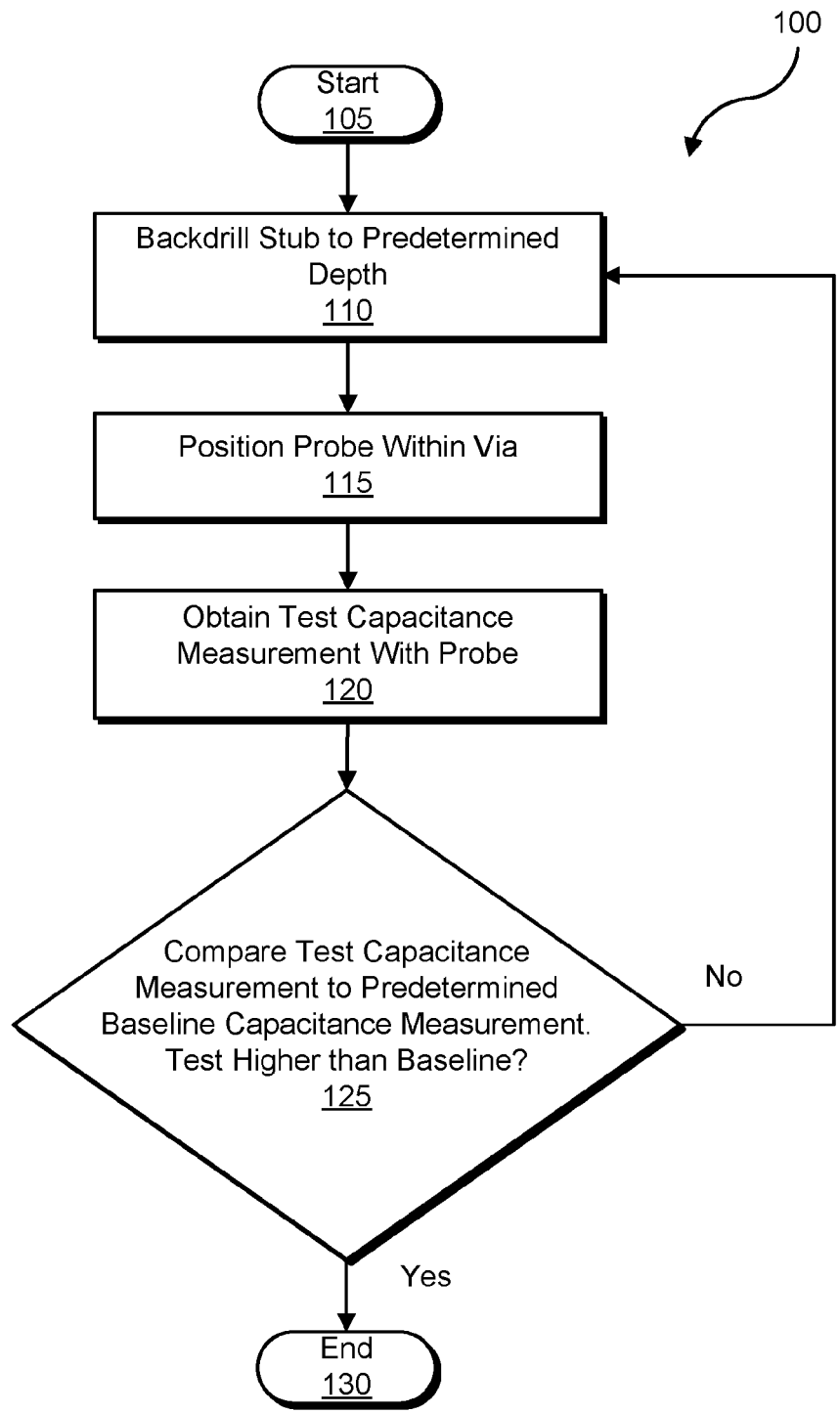
FIG. 1 illustrates a flowchart of a method for assessing residual conductive plating material in a backdrilled stub, in accordance with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to backdrilled stubs. While the present disclosure is not necessarily limited to such applications, various aspects of the disclosure may be appreciated through a discussion of various examples using this context.

Because modern high density printed circuit boards may each contain a significant number of vias to be backdrilled, drill bits used for backdrilling may become worn or damaged relatively quickly. Wear on these bits may lead to increased rates of ineffective drillings (i.e., drillings that do not remove enough plating from the stub portions of the vias). In addition, an ineffective drilling may be caused by a misaligned drill bit that is angled or improperly centered relative to a via. Boring with the misaligned bit may leave large sections of undesirable plating material in the stub portion of the via.

To detect ineffective drillings, several testing methods may be used. Some of the methods may involve electrical continuity tests. For example, a testing method may involve measuring the electrical continuity between two test contact pads on a circuit board to be tested. Prior to backdrilling a via in the test board, these test pads may be electrically connected through a stub portion of the via. After the stub portion has been backdrilled, the electrical continuity between the test pads may be checked. If no continuity is detected (i.e., the backdrilling has eliminated enough plating from the stub to sever the connection between the test pads), then the drilling may be deemed a success. If not, then the drilling may be deemed a failure.

Such testing techniques may not be accurate in all instances and may be susceptible to indicating a successful drilling when an undesirable amount of plating material may still remain in the stub, which may, in effect, give a false positive assessment of the backdrilled via. These false positives may occur in instances where the backdrilling has removed a large enough portion of the plating material to sever the electrical connection between the test pads, but has still left what may be a large section or sections of excess plating in the stub. While removal of all plating material from the stub may not be required, even when the residual plating does not electrically connect the test pads, it may still include enough conductive plating material to adversely affect the integrity of a signal passing through the via during use of the circuit board by an end user.

Referring now to FIG. 1, shown therein is a flowchart of an embodiment 100 of the present invention. Per 105, the process is started. A printed circuit board having one or more vias of one or more types (e.g., plated through hole vias), which may include contact pads surrounding the vias at conductive layers of the board, may be positioned by a manual user or by an automated system beneath a drill bit of a drilling device. The drilling device may take many forms; for example, the drilling device may be part of a printed circuit board manufacturing machine or may be an individualized device, such as a simple drill press. A manufacturing machine may include computer numerical control (CNC) drilling equipment with or without enhancements to aid in controlled depth drilling. The manufacturing machine may be involved in all or a portion of a printed circuit board manufacturing or fabrication process.

In block 110, a stub of one of the vias of the printed circuit board may be backdrilled to a predetermined depth. The depth may be determined based on the depth of the stub portion or may be determined based on an end of a drill bit reaching the depth of a desired trace or contact pad. In some embodiments, the backdrilling may involve a means of confirming that the predetermined depth has been reached by an end of the drill bit. One such means may be a simple continuity test wherein a break in the continuity of an electrical circuit in the printed circuit board may act as an indication that the end of the drill bit has reached the end of the stub portion.

In block 115, a capacitance probe may be placed within the via. The capacitance probe may be lowered into the backdrilled stub of the via using a probe deployment device, of which the probe may be a part. The probe deployment device may be part of the same manufacturing machine as the drilling device or may be a separate device altogether. It may include a mechanical arm, controlled pneumatically or otherwise, designed to raise or lower the probe in a controlled manner. The probe may be positioned into the via after the drill bit has performed the backdrilling and has been removed or the drill bit itself may form a portion of the capacitance probe and capacitive sensors may be located within the drill bit. In some embodiments, the drill bit may be hollow and the probe may be lowered into or through the drill bit into the backdrilled stub. While the probe is positioned, the drill bit may remain in the via or the drill bit may be raised, either completely or partially, out of the stub during or before the lowering of the probe.

A test capacitance measurement may be obtained with the capacitance probe per block 120. The test capacitance measurement may be a measurement of the mutual capacitance between one or more sensors of the capacitance probe and the residual plating material remaining in the via after the backdrilling. As shown in more detail in FIGS. 2A-2C and 3A-3C, the test capacitance measurement may be indicative of the success or failure of the backdrilling. In some embodiments, a higher capacitance measurement obtained with the probe may indicate that more plating material remains in the measured via. Excessive residual material remaining in a backdrilled via may have a number of possible causes. For example, the drill bit may have been misaligned with the via causing the bit to only remove a portion of the plating material (for example, only one side of the plated stub) during the drilling process. Another possible cause of excessive residual material may be that the drill bit or the printed circuit board may have been at an improper angle during the process, thereby causing the drilling to be slanted. Yet another possible cause may be that the drill bit may have been worn down by previous usage causing the drill bit to miss relatively large portions of the plating material in the stub during the drilling process.

In block 125, a comparison may be made between the test capacitance measurement and a predetermined baseline capacitance measurement. This comparison may be usable in determining whether the drilling was successful. The comparison may be made by a computer or by an individual. In some embodiments, the baseline capacitance measurement may be predetermined prior to the comparison. The baseline capacitance measurement may be determined, for example, by using the capacitance probe in conjunction with a control printed circuit board. The control board may be identical in design to the test circuit board (i.e., the circuit board being drilled in method 100) and may have been tested by some means to confirm that its vias have been properly drilled (i.e., less than a threshold maximum amount of residual Copper material remains in every backdrilled stub of the control board). Per another example, a baseline capacitance measurement may be determined by placing the capacitance probe in a non-plated hole. In some embodiments, this non-plated hole may serve as a calibration feature. In yet another example, the baseline measurement may be determined based on mathematical calculations relying on information about the test board and known requirements for the ultimate use of the test board. Using this means of establishing a baseline measurement may not require a control board. A baseline capacitance measurement may be indicative of an ideal backdrilling process (i.e., all of the residual Copper being removed from the stub portion of the backdrilled via) or may be indicative of a threshold maximum acceptable amount of plating material remaining in the backdrilled stub.

A determination, based on the comparison in block 125, that the test capacitance measurement exceeds the baseline capacitance measurement may mean that an excessive amount of plating material remains in the stub. In response to this determination, an indicator, for example, the computer performing the comparison, may indicate that the test has been failed. In the embodiment 100, this indication may take the form of an instruction that causes the stub to be re-drilled and re-tested. In other embodiments this indication may take the form a visual fail signal to the operator of the manufacturing machine.

In the alternative, if the comparison of block 125 results in a determination that the test capacitance measurement does not exceed the baseline measurement, then there may be less than the threshold amount of conductive plating material (for example, Copper) remaining in the backdrilled stub. This positive result may be indicated, for example, by a visual pass signal to the operator. After a successful drilling, the process may, per block 130, be completed. In some embodiments, the backdrilling process 100 may then be repeated for other vias of the test board or the test board may be deemed ready for undergoing other steps in the manufacturing process (e.g., final inspection by a trained individual).

Figure 2:
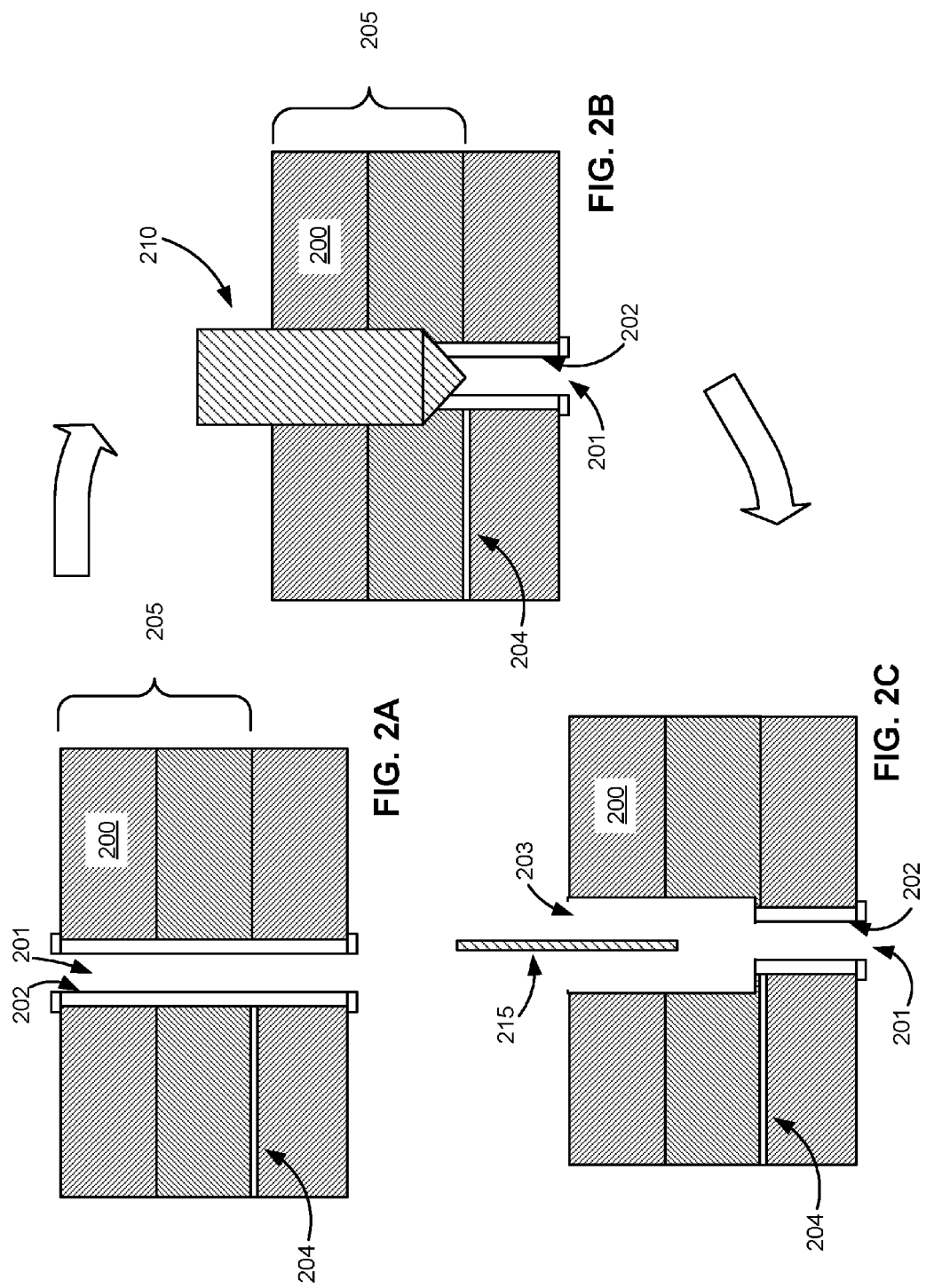
FIGS. 2A, 2B, and 2C illustrate the use of an embodiment of the present invention during a printed circuit board manufacturing process, wherein a backdrilling process is effective.

Turning now to FIGS. 2A-2C, an embodiment of a method of the present invention employed in a successful backdrilling is shown. Per FIG. 2A, a printed circuit board 200 may include a via 201. The via 201 may have plated walls 202. A stub portion 205 may be positioned above the usable lower portion of the via 201, with the usable portion ending at the depth in the printed circuit board wherein trace 204 is positioned. In FIG. 2B, a drill bit 210 may be used to bore into the via 201 to remove the portion of the plated walls 202 along the stub portion 205. Next, in FIG. 2C, the drill bit 210 may be removed, leaving a backdrilled hole 203 (i.e., a backdrilled stub) within the portion of the via that was formerly the stub portion 205. The lower portion of the via 201 may still have plated walls 202. As shown, a capacitance probe 215 may be positioned in the backdrilled stub. More specifically, the probe 215 may be positioned in the backdrilled hole 203 such that it may not make contact with any of the material of the printed circuit board 200. The probe 215 may then be used to obtain a test capacitance measurement. The probe measurement may be compared to a baseline measurement, for example, by being sent to a computer (not shown) for comparison to a baseline measurement. In this example, because the wall plating 202 has been removed from the former stub portion 205, the capacitance measurement may be lower than the baseline capacitance measurement, and the computer or other comparator may indicate that the backdrilling by drill bit 210 was successful.

Figure 3:
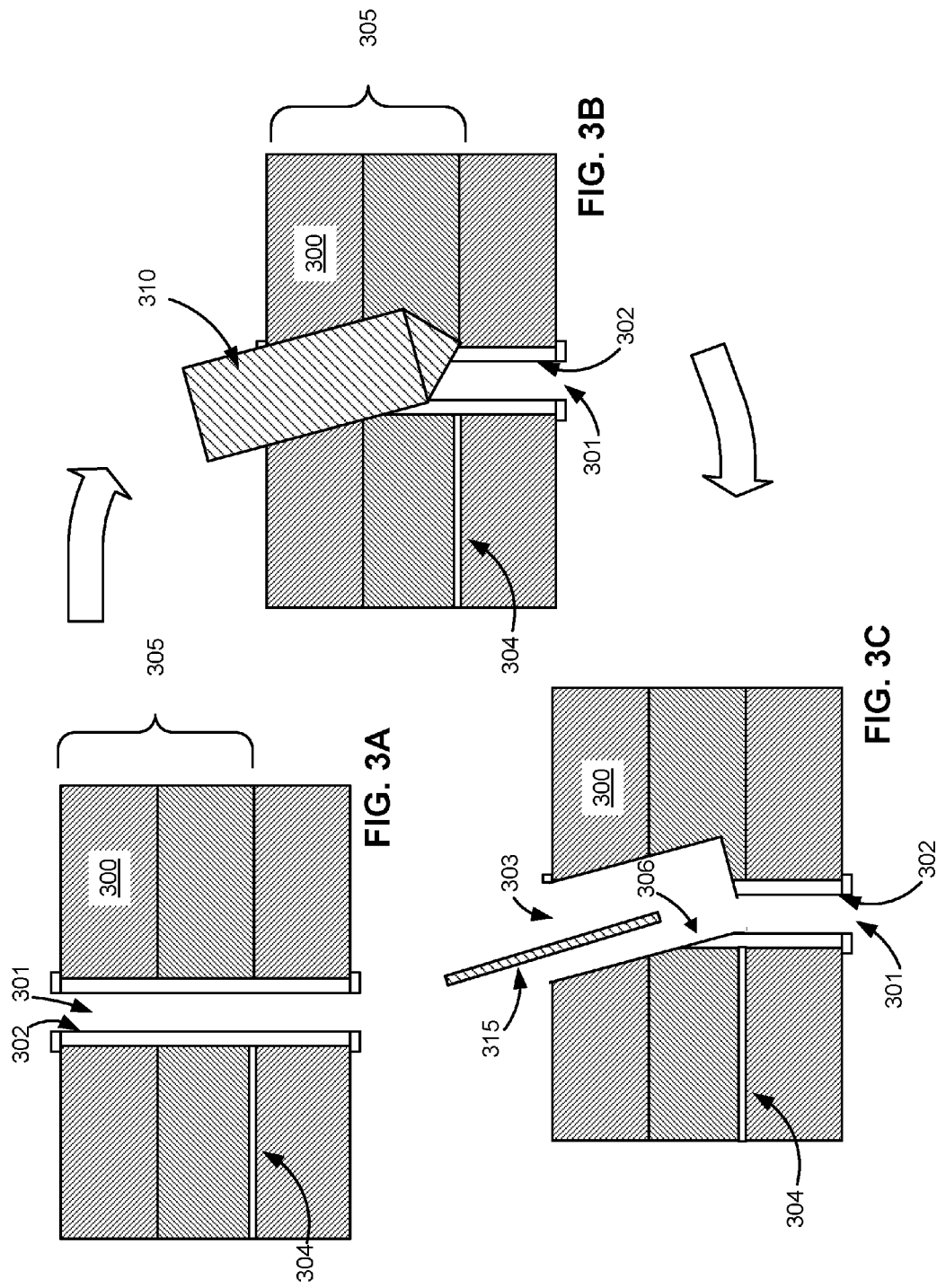
FIGS. 3A, 3B, and 3C illustrate the use of the embodiment of FIGS. 2A-2C in an alternative situation, wherein a backdrilling process is ineffective.

In contrast with FIGS. 2A-2C, FIGS. 3A-3C show an embodiment of the invention used to detect an unsuccessful backdrilling. In FIG. 3A, a printed circuit board 300 is shown. Printed circuit board 300 may be the same as circuit board 200 or may be a different circuit board. In either alternative, as there may be dozens or even hundreds of vias on a given circuit board, via 301 may be a different via than via 201. Via 301 may include plated walls 302 and stub portion 305 positioned above the trace 304. In FIG. 3B, a drill bit 310 (which may be the same as drill bit 210) may be used to bore into stub portion 305 of via 301. As shown, the drill bit 310 may be slanted or otherwise misaligned relative to printed circuit board 300. Next, in FIG. 3C, the drill bit 310 having been removed from the via, a capacitance probe 315 (which may be the same as probe 215) may be inserted into the backdrilled hole 303. The probe 315 may be inserted, and may be at an angle relative to the printed circuit board 300. This may occur, for example, when the printed circuit board 300 is improperly mounted. The probe 315 may also be straight relative to the printed circuit board 300. As shown, a residual amount of plating material 306 may remain in the backdrilled hole 303 (i.e., backdrilled stub). This residual material 306 may increase a test capacitance measurement obtained with the probe 315. The test capacitance measurement may be compared to a baseline measurement, for example, by being sent to a computer (not shown) and compared to a predetermined baseline measurement. The test capacitance measurement may, as a result of the residual material 306, exceed the baseline capacitance measurement. This result may be indicated to an operator, for example, by a visual failure signal or by an automated re-drilling with drill bit 310 of the via 301. It is contemplated that the amount of residual material 306 in the backdrilled stub 305 may not cause the capacitance to exceed the baseline capacitance in instances where the amount of residual material 306 is insignificant or otherwise less than a threshold amount.

In some embodiments, a user may determine an acceptable threshold amount of residual material that may remain in a successfully backdrilled stub and may adjust the baseline capacitance measurement accordingly. The amount of residual material that is deemed acceptable may be determined based on a number of factors including, for example, the sensitivity of the printed circuit board or the importance of the printed circuit board in the proper functioning of a device and/or interface in which it may ultimately be installed for use (e.g., having less residual Copper might be more important in association a higher speed interface).

Figure 4:
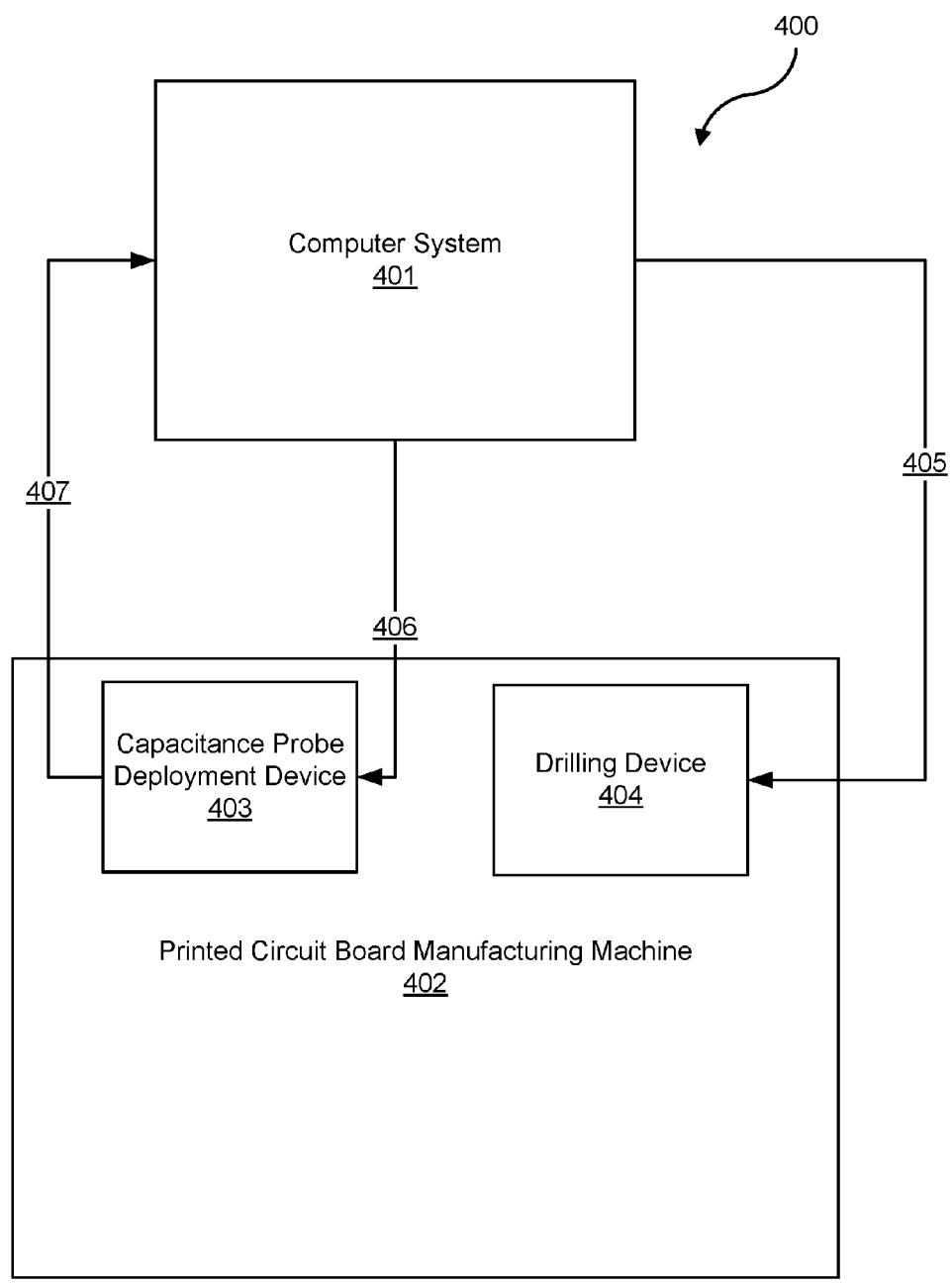
FIG. 4 illustrates a block diagram of a system adapted for assessing residual conductive plating material in a backdrilled stub, in accordance with an embodiment of the present invention.

Turning now to FIG. 4, a block diagram of a system 400 of an embodiment of the present invention is shown. The system may comprise a computer or computer system 401 and printed circuit board manufacturing machine 402. A more high-level block diagram of an example computer system or computer for implementing one or more embodiments of the invention is described below and shown in FIG. 7. The computer 401 may be part of the machine 402 or may be remotely connected thereto. In use, computer 401 may send instructions, per line 405, to a drilling device 404 within the machine 402. The instructions may include an instruction to drill into a via of a printed circuit board positioned within the manufacturing machine 402 with a drill bit of the drilling device 404. The instructions may also include an instruction to drilling device 404 to remove the drill bit upon completion of the drilling to a certain depth within the via. The computer 401 may also send instructions 406 to a capacitance probe deployment device 403 to lower a capacitance probe into the stub backdrilled by the drilling device 404. The probe deployment device 403 may position the probe within the backdrilled stub. A test capacitance measurement may be obtained by probe deployment device 403 and sent to the computer 401 as represented by line 407. The computer 401 may then determine whether the test capacitance measurement is higher than a baseline capacitance measurement and, based thereon, may indicate whether the backdrilling was a success or a failure.

Figure 5B:
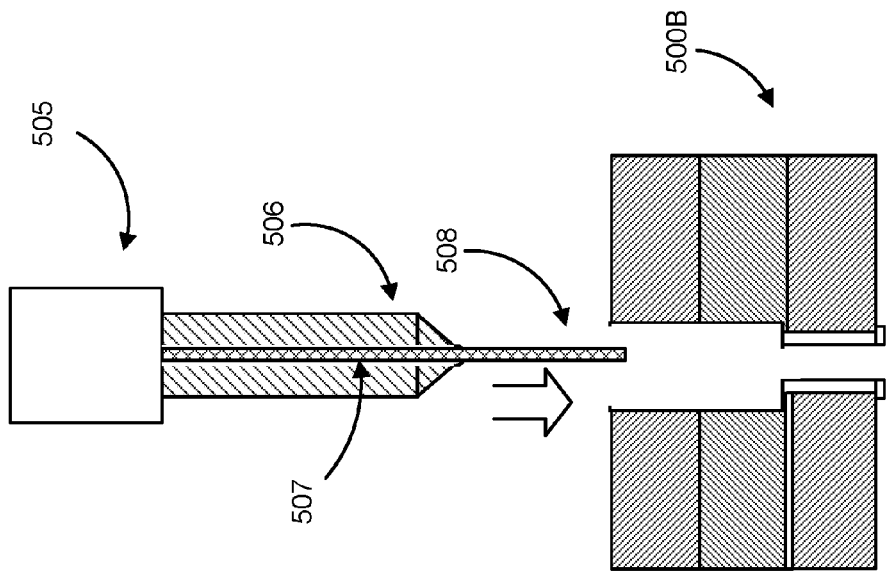
FIGS. 5A and 5B illustrate a hollow drill bit and a capacitance probe being used in sequence by a manufacturing machine performing an embodiment of a method of the present invention.
Figure 5A:
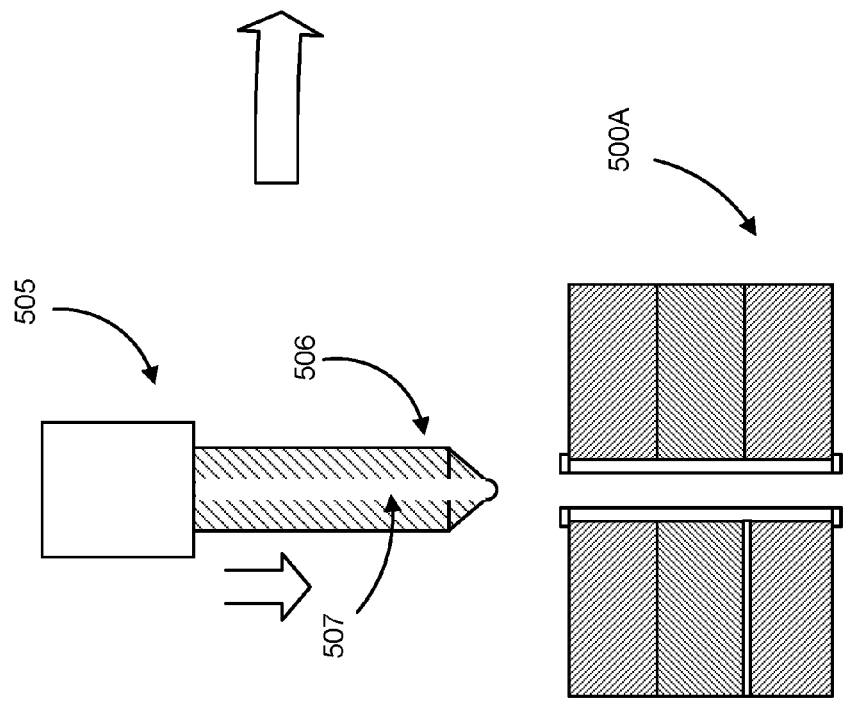

FIGS. 5A-5B and 6A-6B show portions of two of many possible alternative devices for using a method of the present invention. In FIG. 5A, a drill bit 506 held by a collet or chuck 505 of a manufacturing machine is shown positioned above a via of a printed circuit board 500A while being lowered toward the via. The drill bit 506 may be hollow and may have a central tube 507 extending the length of the bit. In FIG. 5B, the same drill bit 506 is shown after having been used to drill into the circuit board, now backdrilled circuit board 500B (formerly circuit board 500A), and having been raised back out of the backdrilled via. A capacitance probe 508 is shown being lowered through the central tube 507 of drill bit 506 into the backdrilled via in order to take a test capacitance measurement. After the test capacitance measurement is obtained, the probe 508 may be withdrawn back through central tube 507, and the test capacitance measurement may be compared with a baseline capacitance measurement to determine if the backdrilling by drill bit 506 was successful.

Figure 6B:
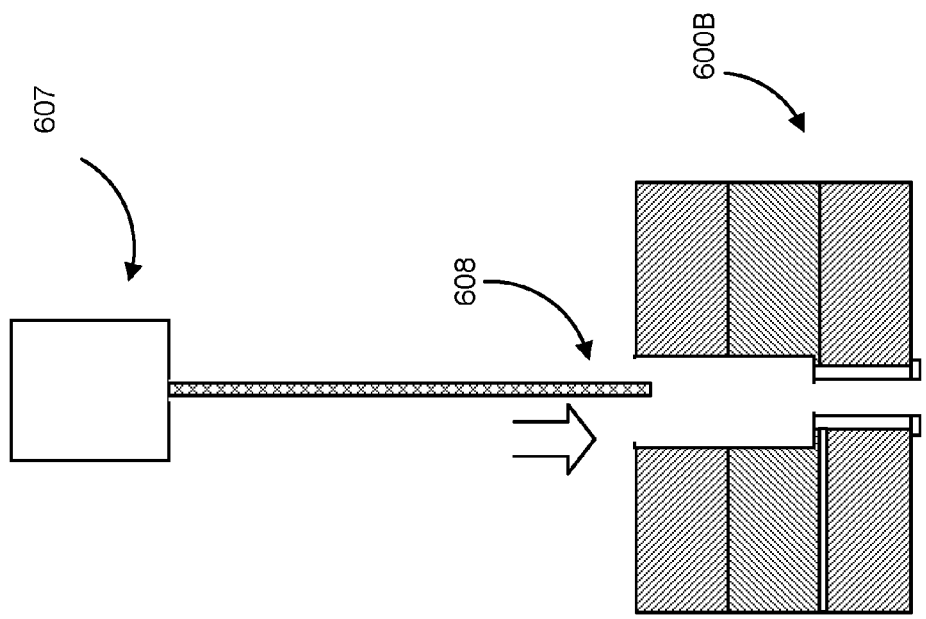
FIGS. 6A and 6B illustrate a portion of a manufacturing machine using a solid drill bit and a capacitance probe, each attached to separate collets, in accordance with an embodiment of a method of the present invention.
Figure 6A:
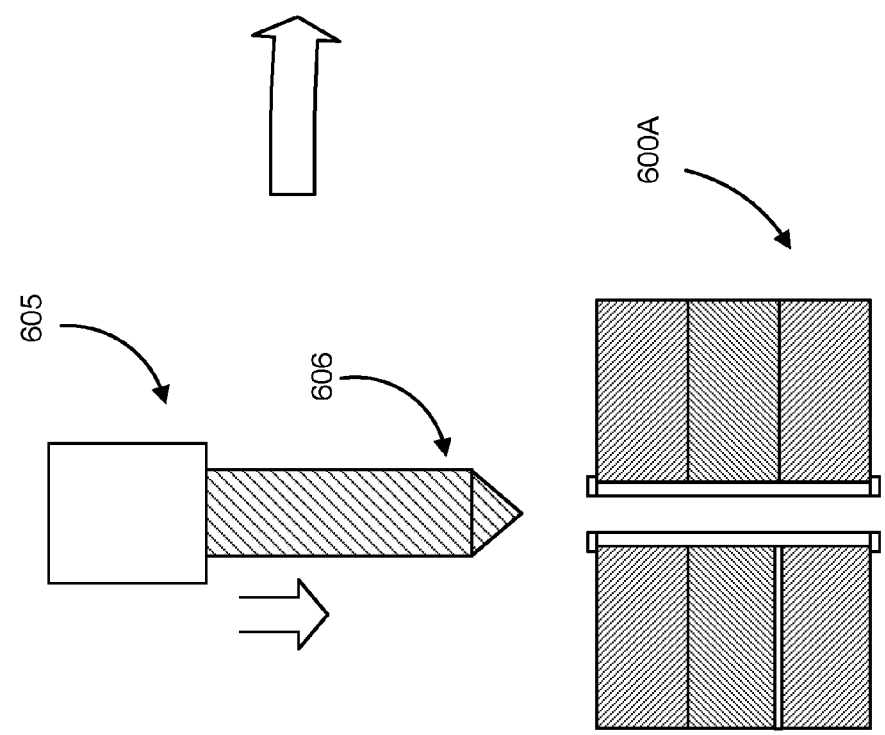

A portion of another alternative embodiment of a device adapted for performing a method of the present invention is shown in FIGS. 6A and 6B. In FIG. 6A, a solid drill bit 606 attached to collet or chuck 605, together comprising a drilling device of a manufacturing machine, may be lowered into a via of printed circuit board 600A. After a drilling is performed by bit 606, the bit 606 may be withdrawn from the circuit board, now backdrilled circuit board 600B (formerly circuit board 600A). The drill bit 606 and collet 605 may then be shifted away from the backdrilled printed circuit board 600B. This movement may be accomplished by a number of means including, for example, by raising the collet 605 or rotating the collet 605, possibly within the manufacturing machine, away from circuit board 600B. Next, per FIG. 6B, a second collet or chuck 607 attached to probe 608, together comprising a capacitance probe deployment device, may then be positioned above circuit board 600B. The probe 608 may be lowered into the backdrilled via, used to obtain a test capacitance measurement, and withdrawn from the via. The test capacitance measurement may be compared with a baseline capacitance measurement to determine if the backdrilling by drill bit 606 was successful. In some embodiments, the collets 605, 607, drill bit 606, and probe 608 may all be part of or controlled by a single manufacturing machine or by multiple machines.

It is contemplated that the methods of embodiments of the present invention could be performed on multiple vias at the same time using a manufacturing machine having multiple probes and drill bits. These multiple vias may be on the same circuit board or on different circuit boards. In some embodiments, multiple vias may be backdrilled at the same time, and probes may be inserted into these vias at the same time. It is further contemplated that some of the substantially simultaneously drilled vias may be successfully drilled while some other drillings may result in failures detected by one or more probes. In some embodiments, the manufacturing machine may be programmed to re-drill only those vias that were deemed failures. The process may be repeated multiple times.

Figure 7:
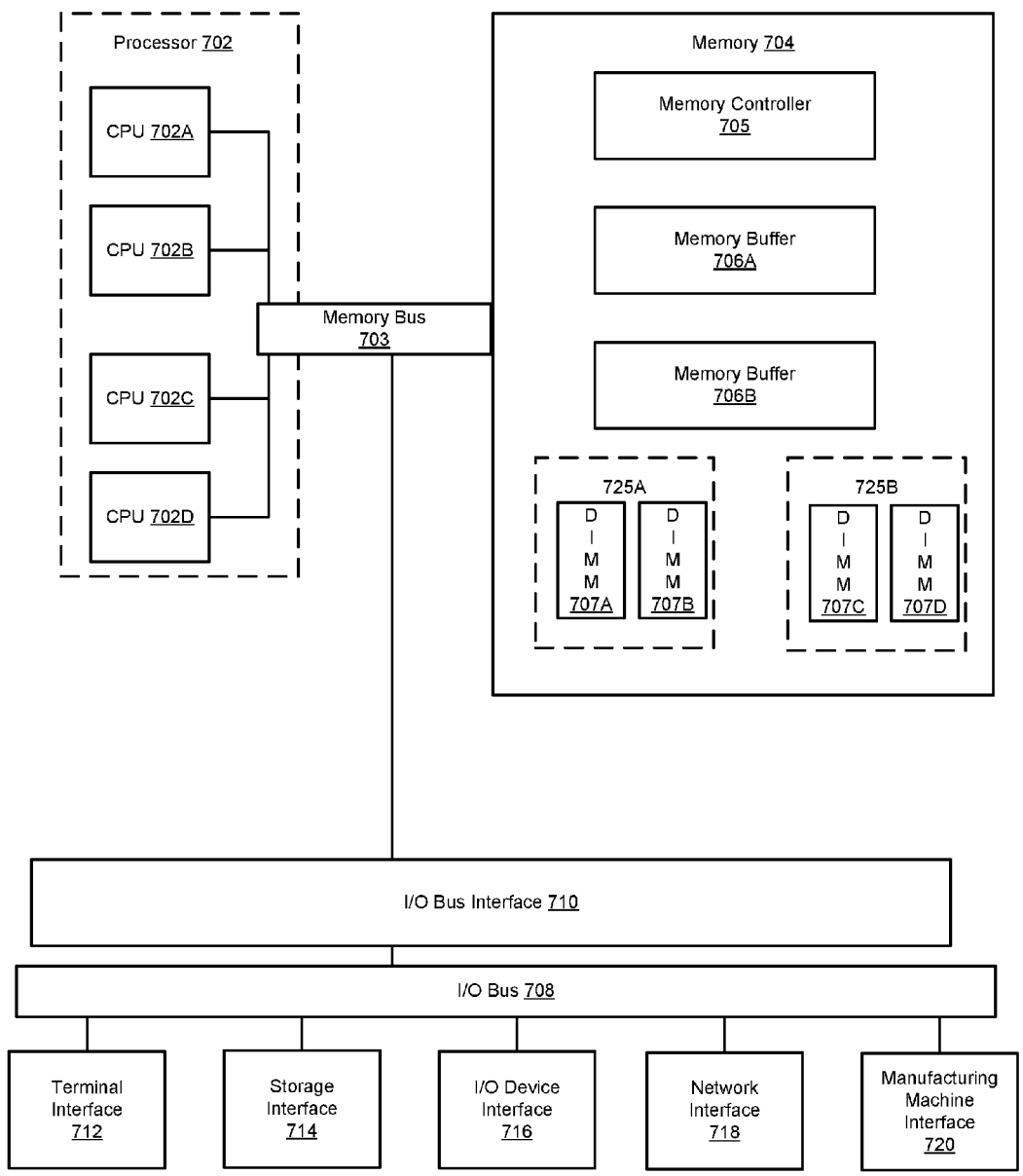
FIG. 7 illustrates a high level block diagram of a computer usable for assessing a residual conductive plating material in a backdrilled stub, according to an embodiment of the present invention.

FIG. 7 depicts a high-level block diagram of an example computer system that may be used in implementing one or more embodiments of the invention. The mechanisms and apparatus of embodiments of the present invention may apply equally to appropriate computing systems used in conjunction with appropriate additional machines as disclosed herein. The major components of the computer system 701 comprise one or more CPUs 702, a memory subsystem 704, a terminal interface 712, a storage interface 714, an I/O (Input/Output) device interface 716, a network interface 718, and a manufacturing machine interface 720, all of which are communicatively coupled, directly or indirectly, for inter-component communication via a memory bus 703, an I/O bus 708, and an I/O bus interface unit 710.

The computer system 701 may contain one or more general-purpose programmable central processing units (CPUs) 702A, 702B, 702C, and 702D, herein generically referred to as the CPU 702. In an embodiment, the computer system 701 may contain multiple processors typical of a relatively large system; however, in another embodiment the computer system 701 may alternatively be a single CPU system. Each CPU 702 executes instructions stored in the memory subsystem 704 and may comprise one or more levels of on-board cache.

In an embodiment, the memory subsystem 704 may comprise a random-access semiconductor memory, storage device, or storage medium (either volatile or non-volatile) for storing data and programs. In another embodiment, the memory subsystem 704 may represent the entire virtual memory of the computer system 701, and may also include the virtual memory of other computer systems coupled to the computer system 701 or connected via a network. The memory subsystem 704 may be conceptually a single monolithic entity, but in other embodiments the memory subsystem 704 may be a more complex arrangement, such as a hierarchy of caches and other memory devices. For example, memory may exist in multiple levels of caches, and these caches may be further divided by function, so that one cache holds instructions while another holds non-instruction data, which is used by the processor or processors. Memory may be further distributed and associated with different CPUs or sets of CPUs, as is known in any of various so-called non-uniform memory access (NUMA) computer architectures.

The main memory or memory subsystem 704 may contain elements for control and flow of memory used by the CPU 702. This may include all or a portion of the following: a memory controller 705, one or more memory buffers 706A and 706B and one or more memory devices 725A and 725B. In the illustrated embodiment, the memory devices 725A and 725B may be dual in-line memory modules (DIMMs), which are a series of dynamic random-access memory (DRAM) chips 707A-7075D (collectively referred to as 707) mounted on a printed circuit board and designed for use in personal computers, workstations, and servers. The use of DRAMs 707 in the illustration is exemplary only and the memory array used may vary in type as previously mentioned. In various embodiments, these elements may be connected with buses for communication of data and instructions. In other embodiments, these elements may be combined into single chips that perform multiple duties or integrated into various types of memory modules. The illustrated elements are shown as being contained within the memory subsystem 704 in the computer system 701. In other embodiments the components may be arranged differently and have a variety of configurations. For example, the memory controller 705 may be on the CPU 702 side of the memory bus 703. In other embodiments, some or all of them may be on different computer systems and may be accessed remotely, e.g., via a network.

Although the memory bus 703 is shown in FIG. 7 as a single bus structure providing a direct communication path among the CPUs 702, the memory subsystem 704, and the I/O bus interface 710, the memory bus 703 may in fact comprise multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 710 and the I/O bus 708 are shown as single respective units, the computer system 701 may, in fact, contain multiple I/O bus interface units 710, multiple I/O buses 708, or both. While multiple I/O interface units are shown, which separate the I/O bus 708 from various communications paths running to the various I/O devices, in other embodiments some or all of the I/O devices are connected directly to one or more system I/O buses.

In various embodiments, the computer system 701 is a multi-user mainframe computer system, a single-user system, or a server computer or similar device that has little or no direct user interface, but receives requests from other computer systems (clients). In other embodiments, the computer system 701 is implemented as a desktop computer, portable computer, laptop or notebook computer, tablet computer, pocket computer, telephone, smart phone, network switches or routers, or any other appropriate type of electronic device.

FIG. 7 is intended to depict the representative major components of an exemplary computer system 701. But individual components may have greater complexity than represented in FIG. 7, components other than or in addition to those shown in FIG. 7 may be present, and the number, type, and configuration of such components may vary. Several particular examples of such complexities or additional variations are disclosed herein. The particular examples disclosed are for example only and are not necessarily the only such variations.

The memory buffers 706A and 706B, in this embodiment, may be intelligent memory buffers, each of which includes an exemplary type of logic module. Such logic modules may include hardware, firmware, or both for a variety of operations and tasks, examples of which include: data buffering, data splitting, and data routing. The logic module for memory buffers 706A and 706B may control the DIMMs 707A and 707B, the data flow between the DIMMs 707A and 707B and memory buffers 706A and 706B, and data flow with outside elements, such as the memory controller 705. Outside elements, such as the memory controller 705 may have their own logic modules that the logic modules of memory buffers 706A and 707B interact with. The logic modules may be used for failure detection and correcting techniques for failures that may occur in the DIMMs 707A and 707B. Examples of such techniques include: Error Correcting Code (ECC), Built-In-Self-Test (BIST), extended exercisers, and scrub functions. The firmware or hardware may add additional sections of data for failure determination as the data is passed through the system. Logic modules throughout the system, including but not limited to the memory buffers 706A and 706B, memory controller 705, CPU 702, and even the DRAM 707 may use these techniques in the same or different forms. These logic modules may communicate failures and changes to memory usage to a hypervisor or operating system. The hypervisor or the operating system may be a system that is used to map memory in the system 701 and tracks the location of data in memory systems used by the CPU 702. In embodiments that combine or rearrange elements, aspects of the firmware, hardware, or logic modules capabilities may be combined or redistributed. These variations would be apparent to one skilled in the art.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for measuring and assessing the adequacy of a backdrilling operation, the method comprising:
   backdrilling a stub of a via formed in a printed circuit board to a predetermined depth;
   positioning a capacitance probe within the via;
   subsequent to the backdrilling to the predetermined depth and the positioning the capacitance probe, using the capacitance probe to obtain a test capacitance measurement;
   comparing the test capacitance measurement to a predetermined baseline capacitance measurement, residual conductive plating material in the backdrilled stub causing the test capacitance measurement to exceed the predetermined baseline capacitance measurement; and
   indicating that the test capacitance measurement exceeds the predetermined baseline capacitance measurement.

2. The method of claim 1, wherein the backdrilling is performed by a drilling device of a printed circuit board manufacturing machine, and wherein the positioning the capacitance probe is performed by a probe deployment device of the printed circuit board manufacturing machine.

3. The method of claim 2, wherein the drilling device comprises a drill bit.

4. The method of claim 3, wherein the probe deployment device comprises the drilling device, and wherein the capacitance probe comprises the drill bit.

5. The method of claim 3, wherein the drill bit is hollow, and wherein the positioning of the capacitance probe further comprises moving the capacitance probe through an end of the drill bit.

6. The method of claim 2, further comprising:
   backdrilling, using a second drilling device of the printed circuit board manufacturing machine, a second stub of a second via formed in a second printed circuit board to a second predetermined depth, the backdrilling of the second stub occurring substantially simultaneously with the backdrilling of the stub;
   positioning, using a second probe deployment device of the printed circuit board manufacturing machine, a second capacitance probe within the second via, the positioning of the second capacitance probe occurring substantially simultaneously with the positioning of the capacitance probe;
   using the second capacitance probe to obtain a second test capacitance measurement;
   comparing the second test capacitance measurement to a second predetermined baseline capacitance measurement, the second test capacitance measurement not exceeding the second predetermined baseline capacitance measurement; and
   indicating that the second test capacitance measurement does not exceed the second predetermined baseline capacitance measurement.

7. The method of claim 1, wherein the comparing the test capacitance measurement to the baseline capacitance measurement is performed by a computer operatively coupled to the capacitance probe.

8. The method of claim 1, wherein the conductive plating material comprises Copper.

9. The method of claim 1, further comprising:
   re-drilling the stub.

10. The method of claim 1, further comprising:
    adjusting the predetermined baseline capacitance measurement based on the sensitivity of an interface with which the via is intended to be associated.

* * * * *